(12) United States Patent   (10) Patent No.: US 8,446,137 B2
Mariani et al.   (45) Date of Patent: May 21, 2013

(54) SWITCHING VOLTAGE REGULATOR AND RELATED FEED-FORWARD CONTROL METHOD

(75) Inventors: Adalberto Mariani, Garlasco (IT); Giulio Renato Corva, Valdagno (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 257 days.

(21) Appl. No.: 12/970,612

(22) Filed: Dec. 16, 2010

(65) Prior Publication Data

US 2011/0148372 A1   Jun. 23, 2011

(30) Foreign Application Priority Data

Dec. 17, 2009 (IT) .............................. VA2009A0092

(51) Int. Cl.
*G05F 1/613* (2006.01)
*G05F 1/656* (2006.01)

(52) U.S. Cl.
USPC ........... 323/284; 323/282; 323/285; 323/286; 323/222; 323/223; 323/224; 363/40; 363/41

(58) Field of Classification Search
USPC ................. 323/282, 284, 285, 286, 222, 223, 323/224; 363/40, 41
See application file for complete search history.

(56) References Cited

U.S. PATENT DOCUMENTS

| | | | | |
|---|---|---|---|---|
| 5,923,191 A * | 7/1999 | Nemetz et al. | ................. | 327/20 |
| 6,580,297 B2 * | 6/2003 | Kojima | ........................... | 327/39 |
| 7,116,143 B2 * | 10/2006 | Deivasigamani et al. | .... | 327/149 |
| 7,208,989 B2 * | 4/2007 | Deivasigamani et al. | .... | 327/149 |
| 7,250,798 B2 * | 7/2007 | Deivasigamani et al. | .... | 327/149 |
| 8,279,917 B2 * | 10/2012 | Takahashi | ..................... | 375/238 |
| 2006/0145745 A1 * | 7/2006 | Deivasigamani et al. | .... | 327/291 |
| 2006/0202732 A1 * | 9/2006 | Deivasigamani et al. | .... | 327/291 |
| 2006/0209620 A1 * | 9/2006 | Deivasigamani et al. | .... | 365/233 |
| 2009/0160414 A1 | 6/2009 | Hachiya et al. | | |
| 2009/0237049 A1 | 9/2009 | Hachiya et al. | ............... | 323/282 |
| 2009/0296805 A1 * | 12/2009 | Takahashi | ..................... | 375/238 |

FOREIGN PATENT DOCUMENTS

EP   1367703   12/2003

* cited by examiner

*Primary Examiner* — Bao Q Vu
(74) *Attorney, Agent, or Firm* — Allen, Dyer, Doppelt, Milbrath & Gilchrist, P.A.

(57) ABSTRACT

A method of controlling a pulse width modulated (PWM) voltage regulator including a control circuit of a power stage, and a circuit configured to determine a duration of charge phases and further configured to receive a charge signal and to generate a logic command may include controlling, using the control circuit, switches of the power stage as a function of the logic command at an end of a charge phase and at a start of a discharge phase of an output capacitance. The method may also include generating the charge signal to be one of enabled and disabled during charge phases and another of enabled and disabled during discharge phases, and delaying, at each PWM cycle, the logic command with respect to a previous PWM cycle to compensate at least one of a phase and a frequency difference between each PWM cycle and a reference clock signal.

22 Claims, 9 Drawing Sheets

SWITCHING VOLTAGE REGULATOR AND RELATED FEED-FORWARD CONTROL METHOD

FIELD OF INVENTION

This invention relates in general to voltage regulators, and, more particularly a feed-forward control method of a switching voltage regulator and an architecture of a voltage regulator that implements it.

BACKGROUND OF THE INVENTION

In pulse width modulation (PWM) regulators, the control circuit switches a power stage to keep an electrical variable (typically the output voltage) equal to a reference value $V_{ref}$ independently from the current that the regulator delivers to a load connected thereto. Synchronizing switching cycles of two or more PWM regulators with a reference clock is particularly useful because it may allow the regulators to be connected together to share the input filter capacitor, as shown, for example, in FIG. 1. If the turning on of the two high side switches HS1 and HS2 is outphased by about half a period, and the two switches are never simultaneously on (the duty-cycle being smaller than 0.5), the capacitance for the input capacitor is smaller than the sum of the capacitances that each regulator would singularly require. This is a significant advantage in terms of reduction of fabrication costs of regulators. Synchronization is also useful for controlling multiphase converters, wherein an outphasing of 360°/N among the N-phase converters is generally required.

In general, in a voltage regulator including of a plurality of switching converters, synchronizing, in frequency, two or more voltage regulators prevents beat phenomena, and generated switching noise in a component regulator from disturbing the other component regulators simply by properly outphasing them.

A traditionally used technique for synchronizing a regulator includes a reference clock for the turning on the high side switch HS in starting a charge phase. The turn off instant of the HS switch, that starts the discharge phase, is determined by the occurrence of a certain condition on the state variable of the regulator. This topology is indicated in literature as synchronous "clocked $T_{on}$" control. The clocked $T_{on}$ control mode is sensitive to switching noise in case of a relatively short charge time $T_{on}$, because the comparator that determines the turn off of the HS switch is influenced by noise generated by the precedent turn on of the HS switch, typically including a sinusoidal disturbance that is dampened by parasitic inductances of the regulator.

By contrast, the technique based on turning off the HS switch synchronously with clock pulses and on turning it on when the output voltage attains a reference value is more robust, even when the charge time $T_{on}$ is relatively short. It is generally a normal practice to add a compensation ramp to the output voltage signal that is sent to the comparator for ensuring stability (with duty-cycle smaller than 0.5). Unfortunately, the slope of this compensation ramp may be determined taking in consideration the slope of the ripple on the output voltage due to the parasitic resistance ESR of the output capacitor that may be one among a relatively large spread of values.

Other topologies are known in literature. For example, the regulator may comprise a comparator for starting a charge interval (HS on) when the output voltage attains a reference value. This mode of control, commonly referred to as "constant $T_{on}$ control," may be implemented, for example, with a regulator as the one shown in FIG. 2. When the output voltage $V_{out}$ falls below a threshold Ilim or, in general, when a certain condition of state variables of the regulator is attained, the block CONTROL LOGIC commands switching from the discharge state to the charge state through the signals HG and LG and raises the START signal indicating that a charge phase is in progress. The monostable circuit ON TIME DELAY receives the START signal and, after a fixed time $T_{on}$, sends the signal OUT to the control logic. The START signal is thus disabled and the regulator starts a discharge phase.

Typically, a minimum duration Toff_min of the discharge phase is set to prevent the regulator from oscillating too fast in transient conditions. With this type of control, the converter is self-oscillating because the working frequency is not tied to a clock, but depends on parameters of the system and on whether it is in steady state or transient condition. The switching PW cycles could hardly be synchronous with an external clock.

The constant $T_{on}$ control mode is adapted to work with small $T_{on}$ values because between each turn on (determined by the comparator) of the HS switch and the precedent turn off, there is an interval that is surely longer than (or at most equal to) Toff_min, during which the noise generated at turn off vanishes. The stability of this control is relatively robust to the spread of the equivalent series resistance (ESR) value of the output filter capacitance.

In the same manner, it may be possible to force the turning off of the high side HS switch (starting a discharge phase) when pulses of the clock signal are received and compare the output voltage with the reference for determining the turn on instant of the charge phase (turning on of the high side HS switch). This topology is indicated in literature as "clocked Toff" synchronous control mode.

The output voltage comparator may be used for determining the starting instant of a discharge phase, that again may have a pre-established duration. In this case, this control is referred to as "constant Toff" control mode. The ensuing discussion of inherent shortcomings and problems will refer to the constant "$T_{on}$ control," though the same observations hold, for the alternative case, in which the comparator of the output voltage determines the beginning of a discharge phase.

FIG. 3 illustrates a schematic diagram of a circuit used in a traditional constant Ton converter for determining the internal $T_{on}$. According to a commonly used technique of PWM driving, the reference voltage $V_{ref}$ and a voltage ramp VC having a slope proportional to the input voltage $V_{in}$, are sent to a comparator that generates the signal OUT to terminate a charge phase and to start a discharge phase. The ramp is typically obtained by charging a capacitance C with a current $V_{in}/R$ proportional to the voltage to be converted $V_{in}$ input to the converter. With this technique, the PWM frequency may be practically independent from the input voltage.

The limits and drawbacks of this technique may be known in that the functioning is negatively influenced by nonlinearities. In particular, delays of the comparator and of the driver may cause important errors for relatively small values of the charge time $T_{on}$. Additionally, for the same charge time $T_{on}$, the switching frequency may depend on the load current, because of the resistive drops in the power switches and in the inductor of the regulator.

With τ being the comparator delay between the voltage VC and the reference $V_{ref}$, D the duty cycle $V_{out}/V_{in}$, Rs the combined series resistance of the power MOS and of the inductor of the regulator, and considering $V_{ref}=V_{out}$, the PWM switching period $T_{sw}$ will be substantially:

$$T_{SW} \cong \left(R \cdot C + \frac{\tau}{D}\right) \cdot \left(1 - \frac{Rs \cdot Iload}{Vout}\right)$$

The switching frequency may be affected by a non-negligible spread depending both on internal parameters (τ), as well as external parameters (Rs, Iload, D), thus the circuit of FIG. 2 may be inappropriate in those applications for which such a large spread may be excessive. In particular, for relatively small duty cycles and large values of the target switching frequency 1/(R·C), the parameter τ/D becomes comparable to the product R·C and the resulting error may be as large as about 100%.

SUMMARY OF THE INVENTION

Investigations carried out by the applicant showed that several of the above-mentioned problems may be addressed by nullifying the outphasing or the difference between the frequency of PWM switching cycles and the frequency of a reference clock. Novel buck voltage regulators and related control methods have been devised that allow adjustment of the duration of charge phases such to nullify/compensate the phase or frequency difference between the PWM cycle and a reference clock cycle.

According to an embodiment, the end instant of a charge phase and start a discharge phase may be determined by the assertion of a logic command OUT, resulting by comparing a voltage ramp with a voltage $V_2$, the value of which may be adjusted at each cycle as a function of the phase or frequency difference between a reference clock and active edges of a charge phase control signal. The voltage ramp may have a constant slope or a variable slope as a function of the input voltage of the regulator.

A regulation system including of a plurality of the novel regulators for supply in parallel a load is also disclosed. According to an exemplary embodiment, the regulation system may include two regulators, wherein one regulator adjusts the duration of charge phases to nullify/compensate the phase difference, and the other regulator may adjust the duration of charge phases to nullify/compensate the frequency difference between PWM cycles and a clock reference signal.

DETAILED DESCRIPTION OF THE PREFERRED EMBODIMENTS

Figure 4:
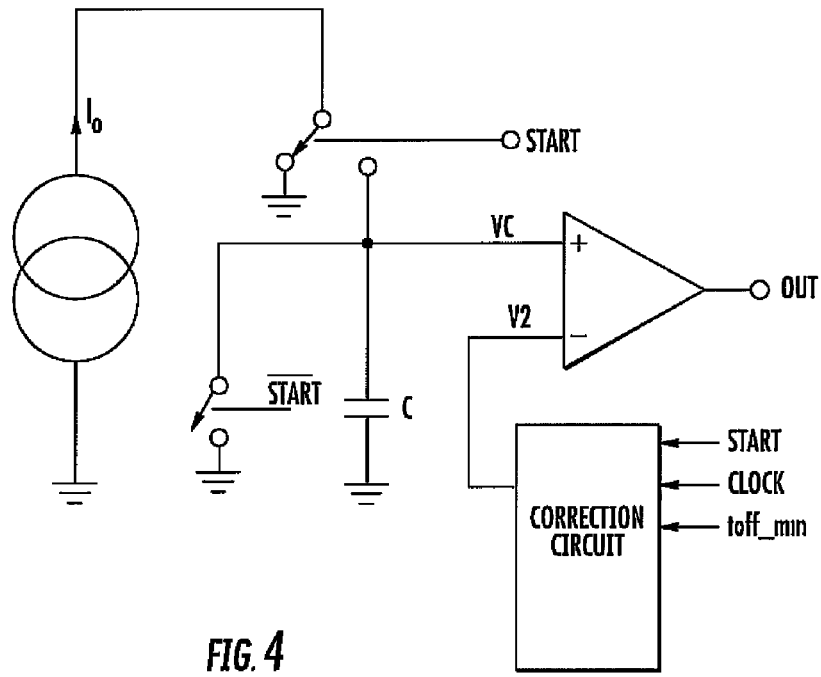
FIG. 4 is a schematic diagram of an analog circuit of a voltage regulator for generating the logic command OUT that signals the end of a charge phase to nullify the phase difference between PWM cycles and a clock in accordance with the present invention.

The feed-forward control method of a voltage regulator may be implemented using an analog circuit or a digital circuit. For the prior art regulator of FIG. 2, an exemplary analog control circuit of a voltage regulator adapted to implement the control method of this disclosure is shown in FIG. 4.

Figure 3:
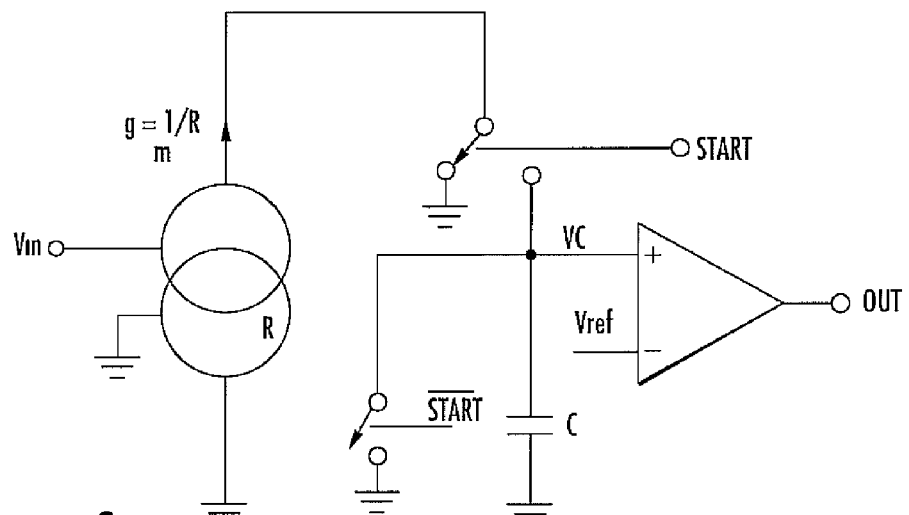
FIG. 3 is a schematic diagram of a known analog circuit for generating the logic command signal OUT that signals the end of a charge interval in accordance with the prior art.
Figure 5:
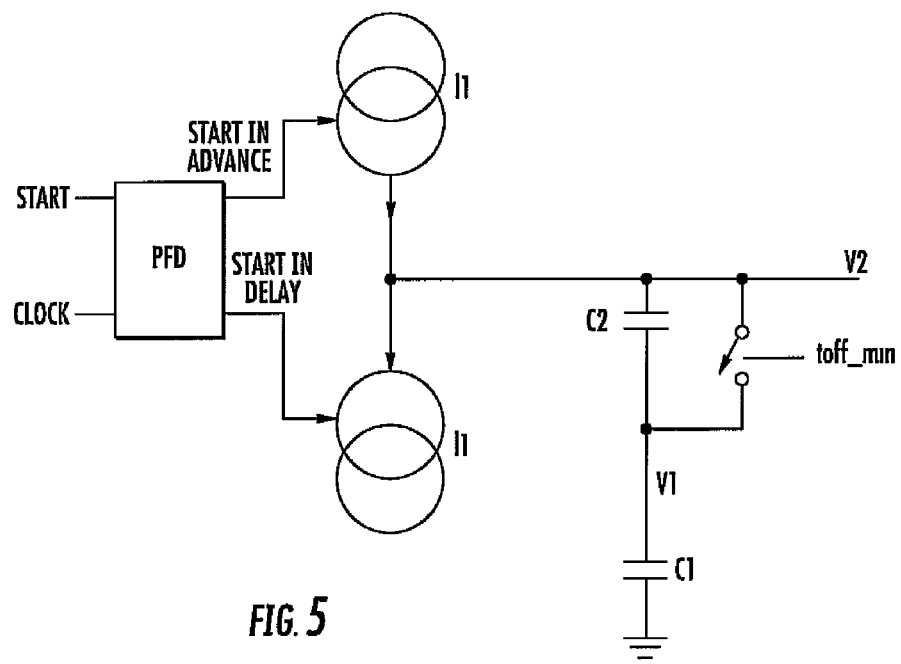
FIG. 5 is a schematic diagram of an exemplary embodiment of the correction circuit of FIG. 4.

Differently from the known analog control circuit of FIG. 3, the voltage reference $V_2$, with which the voltage ramp VC is compared, is not fixed as in the prior art control circuit of FIG. 3, but it is adjusted at each PWM period by the correction circuit. This correction circuit may be, for example, realized as shown in FIG. 5. The phase comparator PFD receives the start signal START and the reference clock and generates a respective logic signal ADVANCE or DELAY depending on whether the start signal START occurs before or after the clock. These logic signals may remain active for a duration corresponding to the anticipation or delay, respectively, between the clock and the signal START, and enable the current generators I1 that charge/discharge for the anticipation/delay time a capacitance on which the comparison voltage $V_2$ is made available.

In the illustrated embodiment, this capacitance includes capacitors $C_1$ and $C_2$ connected in series. This choice is based upon having the possibility of discharging the capacitor $C_2$ through the switch SW2 once per period (for example, for an interval Toff_min lasting sufficiently long for discharging the capacitor $C_2$), such to have in the transfer function of the loop gain a "zero" (for ensuring the stability) and a "pole" determined by the capacitor $C_2$ (for having a null phase error in steady state conditions). If other means or components useful for ensuring the stability of the loop were present, a single capacitor may be used instead of the two capacitors $C_1$ and $C_2$ connected in series.

Substantially, the analog circuit of FIG. 5 adjusts the reference $V_2$ at each PWM cycle by reducing it with respect to the previous cycle if the charge signal START is delayed with respect to the clock, or by increasing the reference voltage in opposite case. With this technique, the duration of the charge phase is reduced if the charge signal START is delayed with respect to the clock, or is prolonged in the opposite case. Reducing the duration of the charge phase makes the conditions on the regulated output voltage that lead to a novel charge phase be verified with an anticipation with respect to the previous cycle, thus obtaining the desired synchronization with the reference clock.

Figure 6A:
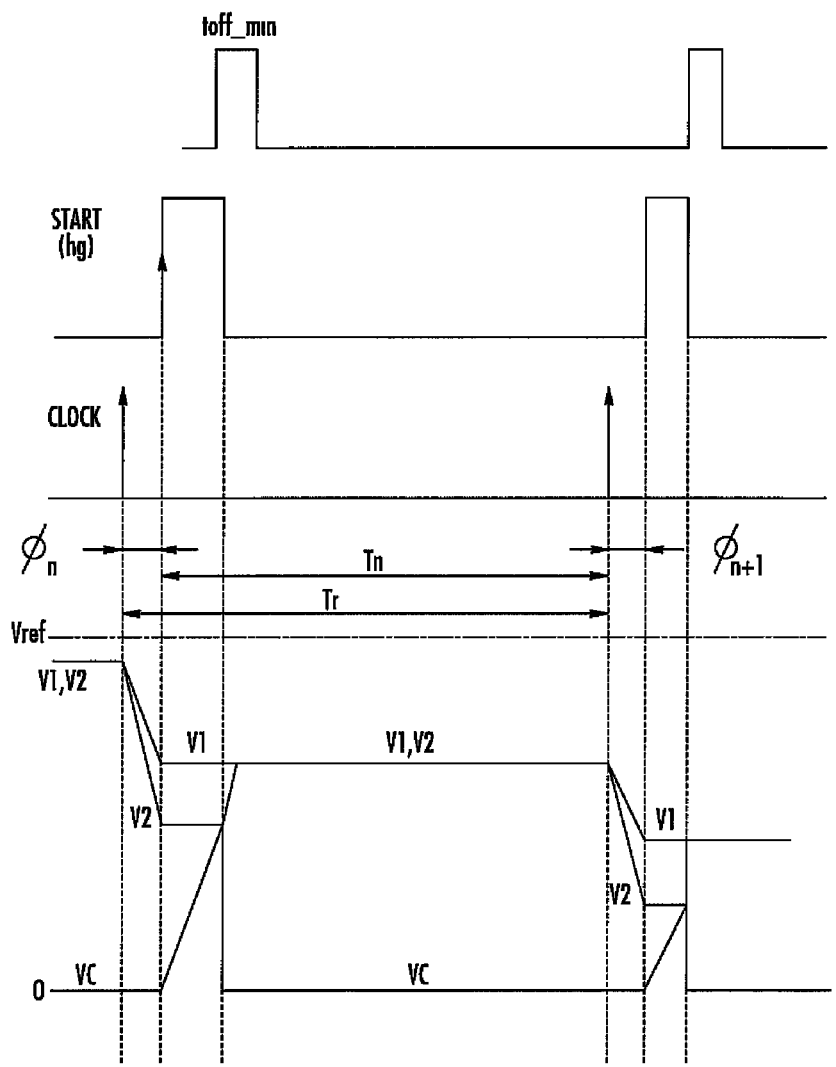
FIG. 6a shows exemplary time graphs of the functioning of the circuits of FIGS. 4 and 5 in case of anticipation between the clock and the discharge signal START.
Figure 6B:
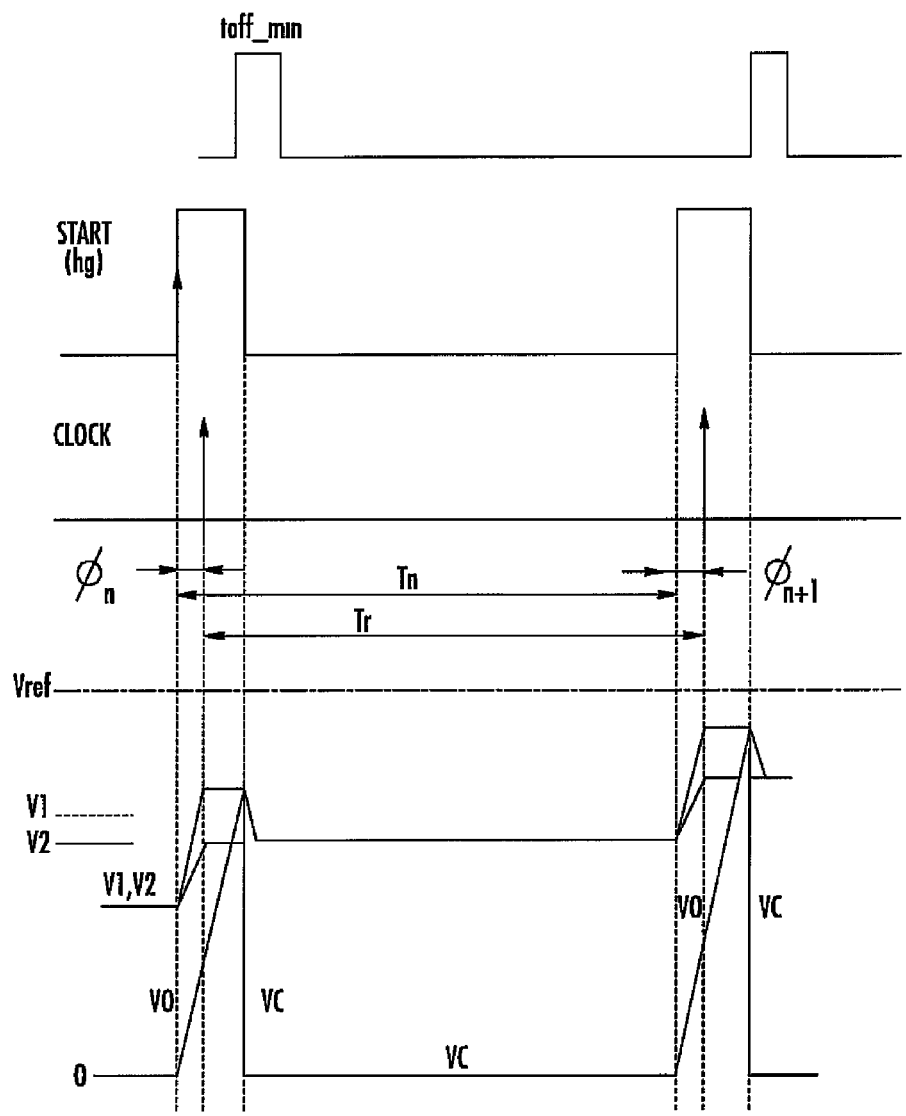
FIG. 6b shows exemplary time graphs of the functioning of circuits of FIGS. 4 and 5 in case of delay between the clock and the discharge signal START.

Exemplary time graphs of the functioning of the circuit of FIG. 5 are shown in FIGS. 6a and 6b in which the charge signal START is respectively delayed or anticipates the clock signal. If the converter is slower than the clock, the phase comparator PFD signals an anticipation of the clock with respect to the signal START, and the comparison voltage $V_2$ is reduced. The lower bound for the comparison voltage $V_2$ is zero.

If the converter oscillates faster than the clock, then the signal START anticipates the clock and the two capacitors $C_1$ and $C_2$ are charged. The charge interval Ton increases, thus reducing the frequency error, until the loop reaches the equilibrium.

In the embodiment of FIG. 4, the current generator $I_0$ charges the capacitor C with a constant current. Thus the voltage ramp has a fixed slope. By contrast, in the embodiment of FIG. 7, the current generator is controlled by the input voltage $V_{in}$ of the regulator. In this other embodiment, the slope of the voltage ramp is not fixed but depends on the input voltage $V_{in}$.

Figure 8:
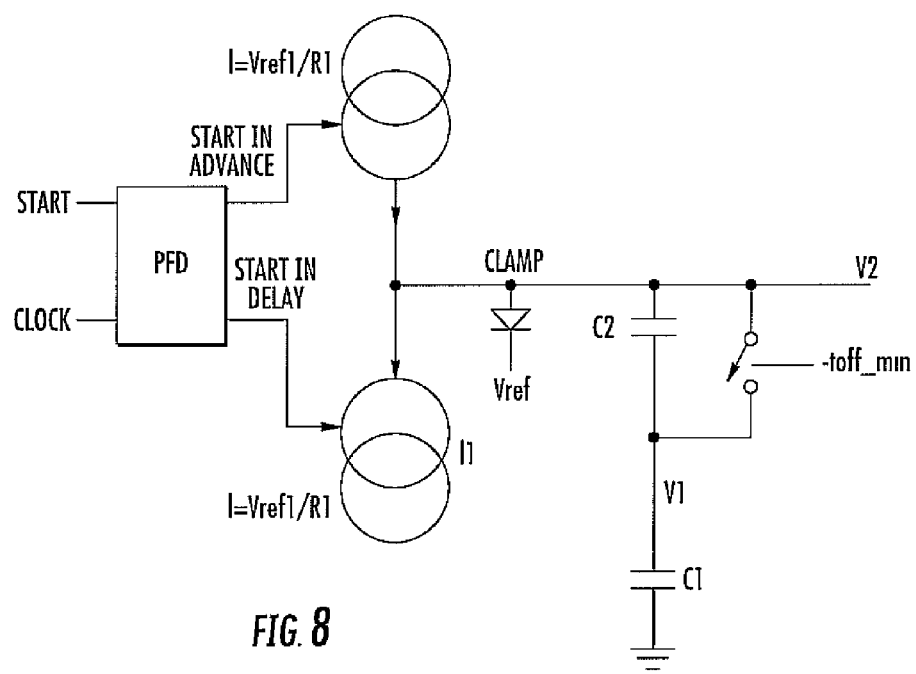
FIG. 8 is a schematic diagram of another exemplary embodiment of the correction circuit of FIG. 4.

Optionally, a voltage clamp CLAMP, that in the exemplary embodiment of FIG. 8 is a diode, may be connected so that the comparison voltage $V_2$ does not surpass the reference $V_{ref}$ of the output voltage $V_{out}$ of the regulator. The voltage clamp CLAMP acts such that the voltage $V_2$ does not surpass the reference $V_{ref}$. Thus, the oscillation frequency is generally always greater than or at most equal to the so called free-running frequency $f_F$, that is the frequency at which the regulator would oscillate if no synchronization clock was provided, or the PWM frequency of the known regulator of FIG. 2 when using the circuit of FIG. 3 for determining the charge time Ton_f.

For the embodiment of FIGS. 4 and 5, the transfer function of the loop gain $G_{loop}$ is:

$$G_{loop} \cong C \cdot \frac{I_1}{I_0} \cdot \frac{V_{in}}{V_{out}} \cdot \frac{1}{s \cdot T_r} \cdot \frac{1 + s \cdot T_r \cdot \left(\frac{C_1 + C_2}{C_2}\right)}{s \cdot T_r \cdot C_1}$$

wherein $T_r$ is the switching period of the reference clock.

Figure 7:
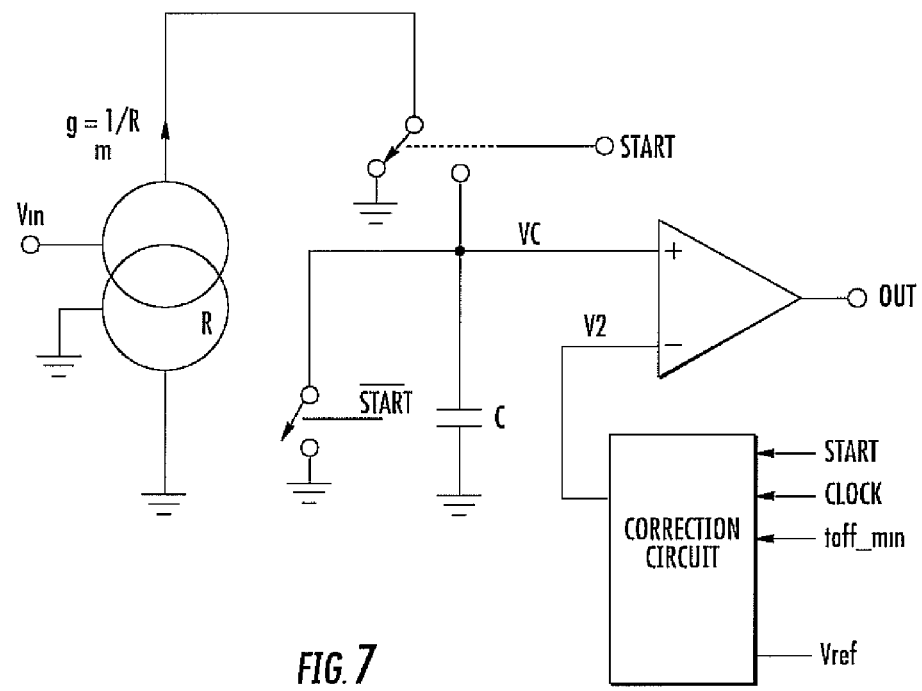
FIG. 7 is a schematic diagram of another analog circuit of a voltage regulator for generating the logic command OUT that signals the end of a charge interval, alternative to the circuit of FIG. 4.

In the embodiment of FIGS. 7 and 8, the current that charges the capacitor C is proportional to the input voltage $V_{in}$ of the regulator, and the charge current of the capacitors $C_1$ and $C_2$ is determined by a reference voltage $V_{ref1}$. Preferably, this reference voltage is proportional to the voltage $V_{ref}$ with which the output voltage $V_{out}$ of the regulator is compared.

In quasi-stationary conditions, the output voltage $V_{out}$ is practically equal to the voltage $V_{ref}$, thus the free-running frequency $f_F$ is:

$$f_F = \frac{1}{RC}$$

If no reference clock is provided, the capacitors $C_1$ and $C_2$ are charged until the voltage $V_2$ reaches the voltage $V_{ref}$ and the switching frequency is the free-running frequency $f_F$. In the constant $T_{on}$ regulation technique, the current limitation is classically formed using a comparator that monitors the current through the inductance of the regulator during a discharge time Toff.

The control logic inhibits the beginning of the charge interval (turning on of the high side HS switch) if the current through the inductance is larger than a pre-established threshold Ilim, even if the comparator of the output voltage indicates that the voltage $V_{out}$ is smaller than the reference $V_{ref}$. In case of functioning in a current limitation mode, the current will oscillate between the threshold Ilim and $$Ton \cdot \frac{Vin - Vout}{L} + Ilim$$

If the $T_{on}$ interval is determined by the circuit of FIG. 3, then $T_{on}$=Ton_f and the previous equation becomes $$\frac{Vref}{RC} \cdot \left(1 - \frac{Vout}{Vin}\right) + Ilim$$

The threshold Ilim may be sufficiently small to ensure the above quantity (that represents the maximum current value that may be accepted on the secondary of the regulator) does not exceed a certain value. For example, this value may be the saturation current of the winding.

If the proposed control is implemented, this type of limitation may still be used. In stationary conditions, the time $T_{on}$ is smaller than Ton_f thus the previous equation represents the worst case. Nevertheless, in transient conditions, it may happen that $T_{on}$=Ton_f, thus it may be desirable to choose the threshold Ilim in a design phase as stated above.

The transfer function of the loop gain $G_{loop}$ is:

$$G_{loop} \cong \frac{R \cdot C}{R_1} \cdot \frac{V_{ref1}}{V_{out}} \cdot \frac{1}{s \cdot T_r} \cdot \frac{1 + s \cdot T_r \cdot \left(\frac{C_1 + C_2}{C_2}\right)}{s \cdot T_r \cdot C_1}$$

wherein $T_r$ is the switching period of the reference clock and $R_1$ is the proportionality constant between the current I of the phase comparator PFD and $V_{ref1}$.

The loop gain presents two poles in the origin and a zero:

$$f_z = \frac{1}{2\pi \cdot T_r \cdot \left(\frac{C_1 + C_2}{C_2}\right)}$$

To ensure the stability of the feedback it may be necessary to position the zero before the unitary cut-off frequency $f_{BW}$ of the loop. The loop gain, at frequencies much greater than that of the zero, may be approximated as follows:

$$G_{loop} \cong \frac{R \cdot C}{R_1} \cdot \frac{V_{ref1}}{V_{out}} \cdot \frac{1}{s \cdot T_r} \cdot \frac{C_1 + C_2}{C_1 \cdot C_2}$$

thus the unitary cut-off frequency $f_{BW}$ is:

$$f_{BW} = \frac{R \cdot C}{R_1} \cdot \frac{V_{ref1}}{V_{out}} \cdot \frac{1}{2\pi \cdot T_r} \cdot \frac{C_1 + C_2}{C_1 \cdot C_2}$$

By making the frequency $f_Z$ of the zero is much smaller than the cut-off frequency $f_{BW}$, $$\frac{R \cdot C}{R_1 \cdot C_1} \cdot \frac{V_{ref1}}{V_{out}} \cdot \left(\frac{C_1 + C_2}{C_2}\right)^2 \gg 1 \quad (1)$$

The unitary gain frequency should be smaller than the switching frequency of the controller, which is equal to the frequency of the reference clock, $$f_{BW} \ll \frac{1}{T_r}$$

from which, $$\frac{R \cdot C}{R_1} \cdot \frac{V_{ref1}}{V_{out}} \cdot \frac{1}{2\pi} \cdot \frac{C_1 + C_2}{C_1 \cdot C_2} \ll 1 \quad (2)$$

To make inequalities (1) and (2) verified, it may be necessary to impose the condition $C_1 \gg C_2$, that may be easily imposed. It is worth noticing that, when this condition is satisfied, inequalities (1) and (2) may be easily verified independently from external parameters $V_{in}$ and $V_{out}$, provided that $V_{ref1}$ is proportional to $V_{out}$.

The novel control method is capable of restoring synchronization between the switchings of the regulator and the clock signal, also in case of load transients of the converter. For example, if an abrupt increase of the load current, that causes the output voltage Vout to decrease below the reference $V_{ref}$, is verified, the duration of the discharge phase is reduced to the minimum Toff_min. The switching frequency of the regulator tends to be greater than that of the reference clock, thus a delay takes place (FIG. 6b). By implementing the proposed method, the novel regulator would increase the duration $T_{on}$ of the charge phase, thus reducing the PWM switching frequency for restoring it in synchronization with the reference clock. Once the transient has elapsed, after several clock periods, the duration $T_{on}$ returns to the steady state value. The fact that the novel regulator tends to be synchronized with a reference clock makes it particularly suitable to be connected to other regulators of the same type uniformly outphased to share the input filter capacitance, and, thus to form a multiphase regulator.

The correction block depicted in FIG. 4 or FIG. 7 may also be formed in digital form instead of an analog form. The possible digital embodiments are not shown in the attached figures because they are obtainable by a skilled person in view of what has been described above and of the following remarks, and referring to FIGS. 4, 5, 7, and 8.

According to an exemplary digital embodiment, the correction block stores, for example, a counter or register, that stores a value that is incremented or decremented corresponding to the anticipation or delay between the reference clock and the charge signal START. As a function of the stored value, the comparison voltage $V_2$ is generated, for example, through an analog-to-digital converter.

Figure 9:
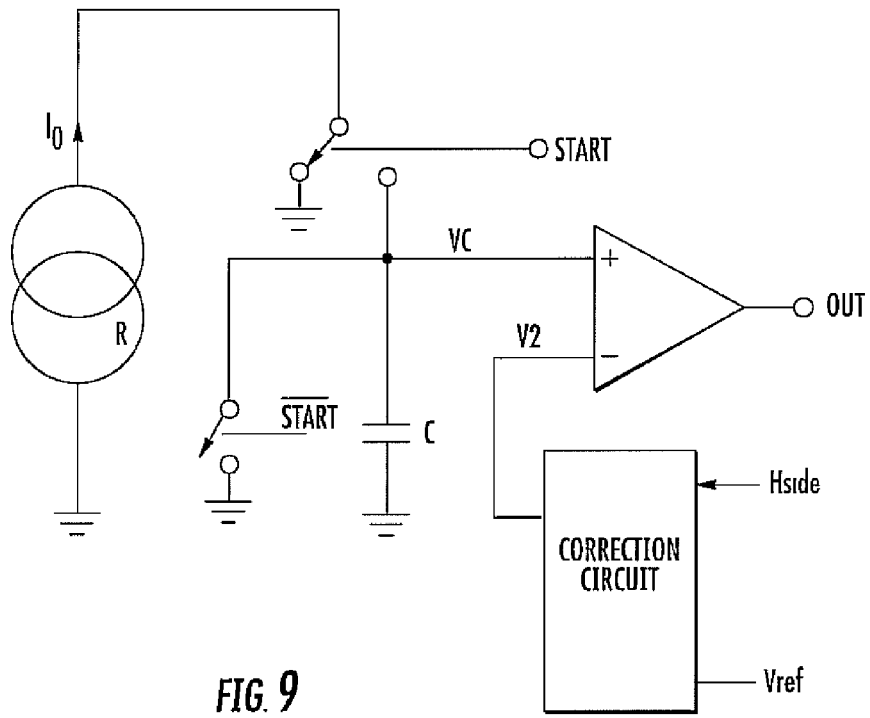
FIG. 9 is a schematic diagram of an analog circuit of a novel voltage regulator for generating the logic command OUT that signals the end of a charge interval such to nullify the frequency difference between PWM cycles and a clock.
Figure 11:
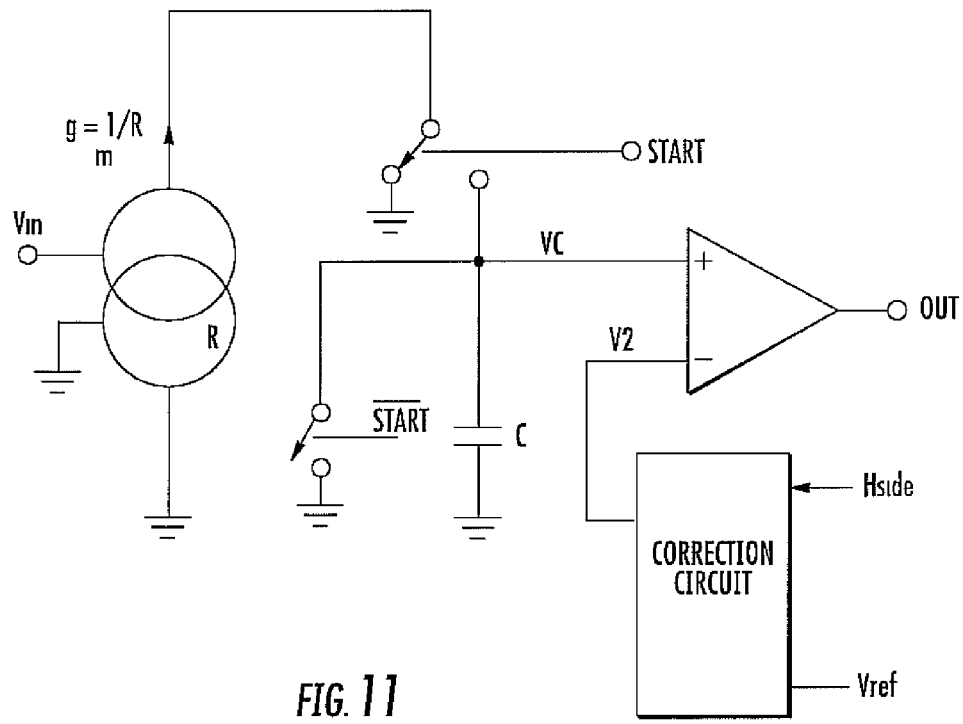
FIG. 11 is a schematic diagram of another analog circuit of a voltage regulator for generating the logic command OUT that signals the end of a charge interval such to nullify the frequency difference between PWM cycles and a clock in accordance with the present invention.

The circuits of FIGS. 9 and 11 may be used for forming regulators capable of synchronizing PWM cycles with the frequency of a reference clock to nullify the difference between the turn-on frequency of the HS switch (frequency of the beginning of the charge phase) and the clock frequency.

Figure 10:
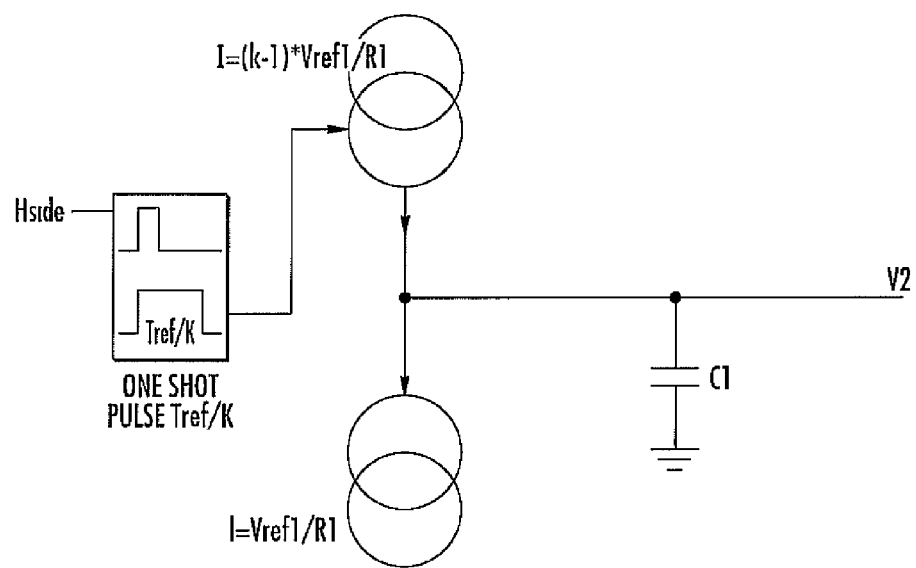
FIG. 10 is a schematic diagram of an exemplary embodiment of the correction circuit of FIG. 9.
Figure 12:
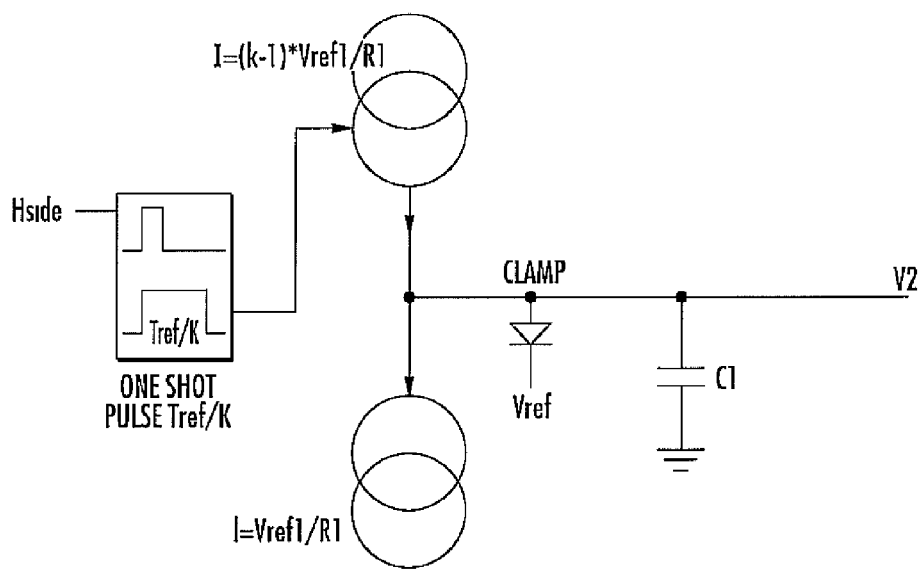
FIG. 12 is a schematic diagram of another exemplary embodiment of the correction circuit of FIG. 10.

The signal $V_2$ is generated by a correction circuit, that for example may be realized as illustrated in FIGS. 10 and 12.

A monostable circuit generates a logic pulse of a duration equal to $T_{ref}/k$ corresponding to the leading edge of the turn on signal of the HS switch that identifies the beginning of a charge phase. For the whole duration of this pulse, the capacitance $C_2$ is charged with a current equal to $(k-1)*V_{ref1}/R_1$. This capacitance is discharged by a current $V_{ref1}/R_1$ for the time interval lasting from the end of the pulse and the successive leading edge of the turn on command of the HS switch. FIG. 12 also shows an optional diode that allows clamping of the voltage $V_2$ to a reference voltage $V_{ref}$.

To make the system reach a stationary condition, the overall charge transferred to the capacitance $C_1$ between two switching Son should be null. This may be possible only if, being Tsw the repetition period of the cycles, Tsw=Tref The repetition period is k times the duration of the pulse of the monostable, independently from any other cause of error or of nonlinearity.

Hereinafter, the calculation of the loop gain $G_{loop}$ is carried out for the embodiment of FIG. 9, wherein ton represents the variation of the charge time with respect to the value that it would have in steady state conditions, and $f_{BW}$ is the cut off frequency of the loop gain $G_{loop}$:

$$t_{on} = \frac{C}{I_0} \cdot V_2$$

$$G_{LOOP} = -\frac{V_{ref1}}{V_{OUT}} \cdot \frac{V_{IN} \cdot C}{I_0 \cdot R_1 \cdot C_1} \cdot \frac{1}{s \cdot T_{ref}}$$

$$f_{BW} = \frac{V_{ref1}}{V_{OUT}} \cdot \frac{V_{IN} \cdot C}{I_0 \cdot R_1 \cdot C_1} \cdot \frac{1}{2 \cdot \pi \cdot T_{ref}}$$

For the circuit of FIG. 11, the parameters $t_{on}$, $G_{loop}$, and $f_{BW}$ are given by the following equations:

$$t_{on} = R \cdot C \cdot \frac{V_2}{V_{IN}}$$

$$G_{LOOP} = -\frac{V_{ref1}}{V_{OUT}} \cdot \frac{R \cdot C}{R_1 \cdot C_1} \cdot \frac{1}{s \cdot T_{ref}}$$

$$f_{BW} = \frac{V_{ref1}}{V_{OUT}} \cdot \frac{R \cdot C}{R_1 \cdot C_1} \cdot \frac{1}{2 \cdot \pi \cdot T_{ref}}$$

An advantage of the circuit of FIG. 11 is in that the loop gain does not depend on the input voltage $V_{in}$. Moreover, making the voltage $V_{ref1}$ proportional to the output voltage $V_{out}$, the cut-off frequency $f_{BW}$ is independent from external factors. In both cases, the loop is stable if the cut-off frequency $f_{BW}$ is much smaller than the PWM switching frequency:

$$f_{BW} \ll 1/T_{ref}$$

According to an embodiment, the voltage $V_{ref1}$ is a scaled replica of the output voltage $V_{out}$. The described frequency control is substantially different from the phase control. During load transients, a constant $T_{on}$ time controller abruptly increases the switching frequency that returns to the steady state value as soon as the current becomes stable, without any abrupt correction of the $T_{on}$ time.

This implies that the loop gain may be limited. Therefore it may not be necessary to feed-forward control the input voltage $V_{in}$ or make the voltage $V_{ref1}$ dependent on the output voltage $V_{out}$, for making the bandwidth independent from external parameters. For this reason, this control may be easily implemented with a digital circuit. Digital embodiments similar to those of FIGS. 9 to 12 are not illustrated in the attached figures because they are obtainable by any skilled person in the light of the following indications, and of what has been described referring to the respective analog embodiments.

According to an exemplary digital embodiment, the regulator comprises a counter synchronized with a high frequency clock. At each clock pulse, this counter increases or decreases its value by a pre-established step when the output of the pulse of the monostable is equal to a logic zero or a logic 1. The counting value is then sent to a digital timing circuit that generates a pulse having a duration proportional to the counting value. The novel regulators may be connected in parallel to supply a load for forming a more complex regulation system.

Figure 1:
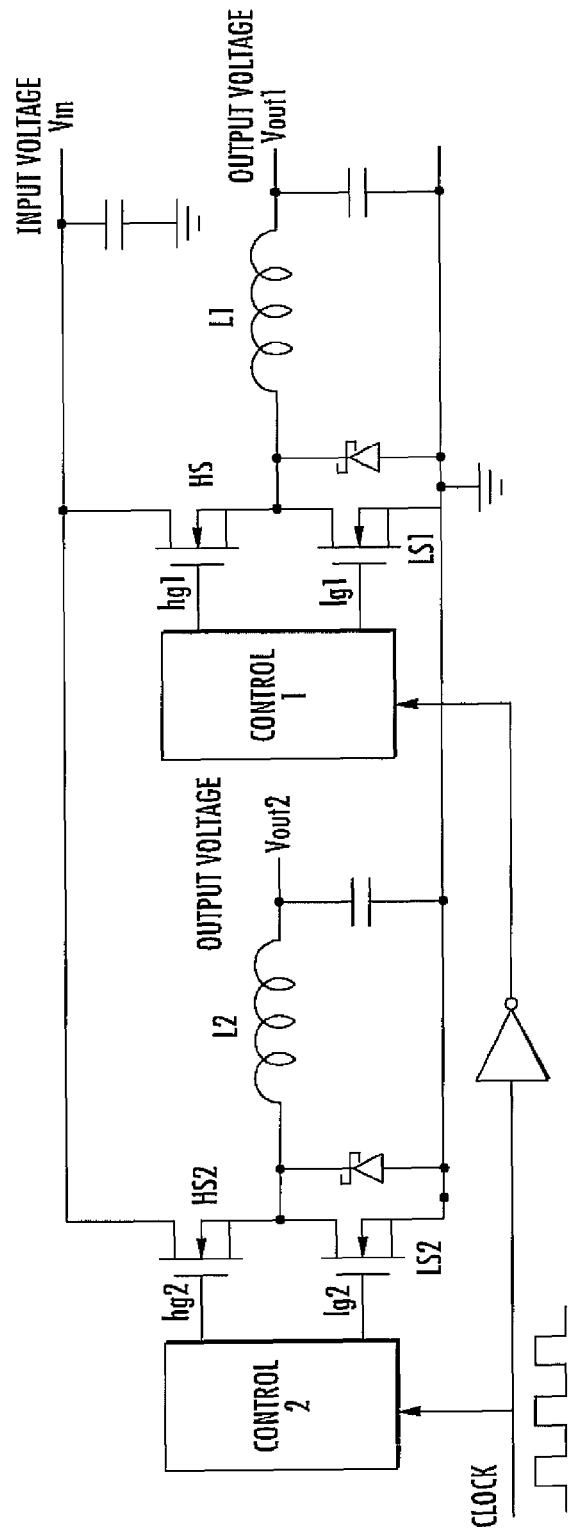
FIG. 1 is a schematic diagram of two DC-DC buck converters that share the same input filter capacitor in accordance with the prior art.
Figure 2:
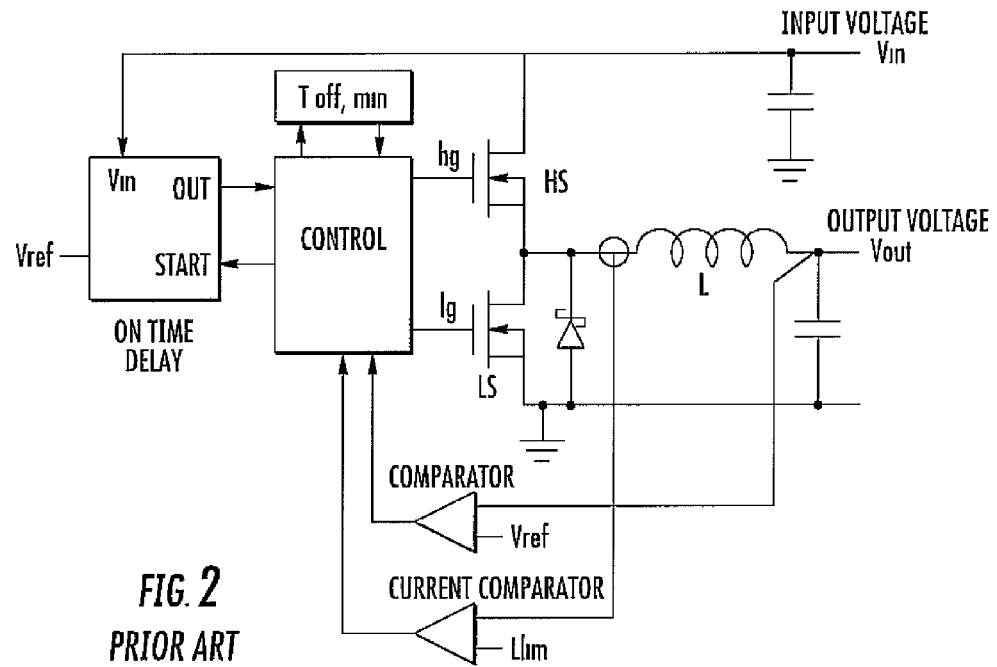
FIG. 2 is a schematic diagram of a buck voltage regulator with feed-forward control in accordance with the prior art.
Figure 13:
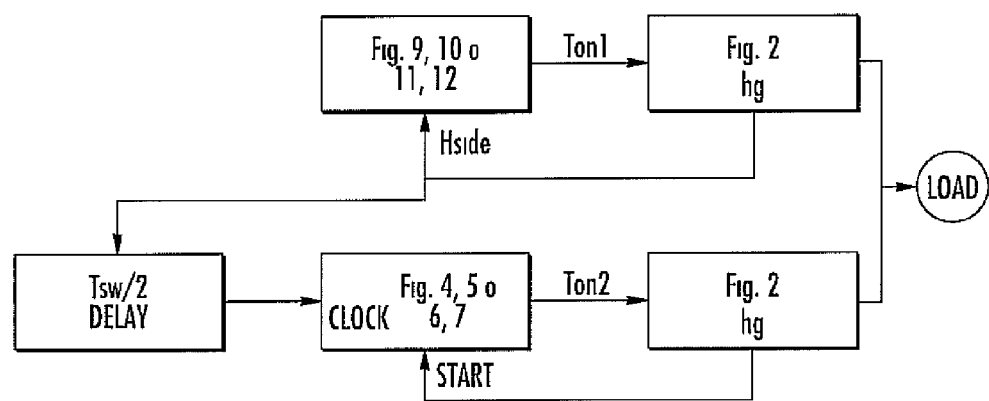
FIG. 13 is a schematic diagram of a regulation system composed of a plurality of regulators that supply a load in parallel in accordance with the present invention.

According to an exemplary embodiment, two regulators of the type shown in FIG. 2 are in parallel connected as shown in FIG. 13 to power load LOAD, as shown in FIG. 1.

The respective circuits ON TIME DELAY of the two regulators are as illustrated in FIGS. 4, 5, 7-12, or the respective digital embodiments thereof as described above. A delay circuit $T_{SW}/2$ DELAY delays, by a half a switching period, the turn on edges of the HS switch of the regulator that nullifies the frequency difference with respect to a reference clock. The second regulator acts to nullify the phase difference between these turn on edges delayed by a half a period and the turn on edges of the respective HS switch. With this technique, in the illustrated regulation system, the two regulators are outphased by half a period, and their turn on frequency, of the respective HS switches, coincides with the frequency of the reference clock.

The invention claimed is:

1. A method of controlling a pulse width modulated (PWM) voltage regulator comprising a control circuit of a power stage, and a circuit configured to determine a duration of charge phases and further configured to receive a charge signal and to generate a logic command, the method comprising:
    controlling, using the control circuit, switches of the power stage as a function of the logic command at an end of a charge phase and at a start of a discharge phase of an output capacitance;
    generating the charge signal to be one of enabled and disabled during charge phases and another of enabled and disabled during discharge phases; and
    anticipating or delaying, at each PWM cycle, the logic command with respect to a previous PWM cycle to synchronize each PWM cycle with a reference clock signal.

2. The method of claim 1, wherein at least one of a phase and a frequency difference between each PWM cycle and a reference clock signal is synchronized.

3. The method of claim 1, further comprising:
    generating a voltage ramp enabled and reset as a function of the enabling and disabling, respectively, of the charge signal;
    comparing the voltage ramp with a comparison voltage and generating the logic command based upon the comparison; and
    generating the comparison voltage by one of charging and discharging a capacitance at each cycle with a charge/discharge current for a time based upon the anticipation or the delay between the reference clock and active edges of the charge signal.

4. The method of claim 1, further comprising:
    generating a voltage ramp enabled and reset as a function of the enabling and disabling, respectively, of the charge signal;
    comparing the voltage ramp with a comparison voltage and generating the logic command based upon the comparison; and
    generating the comparison voltage by incrementing or decrementing a memory element at each cycle at a predetermined rate for a time based upon the anticipation or delay between the reference clock and active edges of the charge signal.

5. The method of claim 3, wherein the comparison voltage is generated by charging the capacitance at each PWM cycle with a charge/discharge current being at least one of constant and proportional to an input voltage of the PWM voltage regulator.

6. The method of claim 1, further comprising:
    generating a voltage ramp enabled and reset as a function of the enabling and disabling, respectively, of the charge signal;
    comparing the voltage ramp with a comparison voltage and generating the logic command based upon the comparison; and
    generating the comparison voltage by charging a capacitance at each PWM cycle with a charge current for a time equal to a fraction of a period of the reference clock signal starting from the enabling of the charge signal, and discharging the capacitance with a discharge current for a time equal to a difference between a duration of a current switching period and the fraction of the period of the reference clock signal.

7. The method of claim 1, further comprising:
    generating a voltage ramp enabled and reset as a function of the enabling and disabling, respectively, of the charge signal;
    comparing the voltage ramp with a comparison voltage and generating the logic command based upon the comparison; and
    generating the comparison voltage by incrementing a memory element at each PWM cycle at a predetermined rate for a time equal to a fraction of a period of the reference clock signal starting from the assertion of the charge signal and decrementing the memory element at each PWM cycle at a predetermined rate for a time equal to a difference between a duration of a current switching period and the fraction of the period of the reference clock signal.

8. The method of claim 6, wherein the comparison voltage is generated by charging the capacitance at each PWM cycle with constant charge and discharge currents.

9. A pulse width modulated (PWM) voltage regulator, comprising:
    a PWM power stage comprising a plurality of switches and a control circuit configured to control said plurality of switches as a function of a logic command for ending a charge phase and starting a discharge phase to an output capacitance, and to generate a charge signal to be one of enabled and disabled during the charge phase and another of enabled and disabled during the discharge phase; and
    a circuit configured to determine a duration of the charge phase, to receive the charge signal, to generate the logic command, and to anticipate or delay, at each PWM cycle, the logic command with respect to a previous PWM cycle to synchronize the PWM cycles with a reference clock signal.

10. The PWM voltage regulator of claim 9, wherein one of a phase and a frequency difference between the PWM cycles and the reference clock signal is synchronized.

11. The PWM voltage regulator of claim 9, wherein said circuit comprises:
a voltage ramp generator configured to generate a voltage ramp, said voltage ramp generator being configured to be enabled based upon enabling of the charge signal, and be reset based upon disabling of the charge signal;
a comparator configured to compare the voltage ramp with a comparison voltage, and to generate the logic command based upon the comparison; and
a correction circuit configured to correct a duration of the charge phase and having an input receiving the charge signal and the reference clock signal, said correction circuit being configured to generate the comparison voltage by one of charging and discharging a capacitance at each PWM cycle with a charge/discharge current for a time based upon the anticipation or delay between the reference clock signal and active edges of the charge signal.

12. The PWM voltage regulator of claim 11, wherein said correction circuit comprises:
a phase comparator having an input configured to receive the charge signal and the reference clock signal, the phase comparator being configured to generate a signal representative of an outphasing between active edges of the charge signal and the reference clock signal;
a current generator configured to be controlled by the representative signal and configured to generate, at each PWM cycle, one of a positive and a negative current pulse of a duration corresponding to the outphasing; and
a capacitive element configured to be one of charged and discharged at each PWM cycle, with one of the positive and the negative current pulses, respectively, and to provide the comparison voltage.

13. The PWM voltage regulator of claim 12, wherein said capacitive element comprises two capacitors electrically coupled in series and configured to be one of charged and discharged at each PWM cycle with the one of the positive and negative current pulses; said correction circuit further comprising a switch configured to short one of said two capacitors for a time sufficient to discharge it when the charge signal is reset.

14. The PWM voltage regulator of claim 11, further comprising a counter, wherein said correction circuit is configured to increment or decrement said counter at each PWM cycle at a predetermined rate for a time based upon the anticipation or delay between the reference clock signal and active edges of the charge signal, and wherein said correction circuit is configured to generate the comparison voltage with an amplitude based upon said counter.

15. The PWM voltage regulator claim 9, wherein said circuit comprises:
a voltage ramp generator configured to generate a voltage ramp and be enabled when the charge signal is enabled, and reset when the charge signal is disabled;
a comparator configured to compare the voltage ramp with a comparison voltage, and to generate the logic command based upon the comparison; and
a correction circuit being configured to correct a duration of the charge phase and having an input receiving the charge signal, and being configured to generate the comparison voltage by charging a capacitance at each PWM cycle with a charge current for a time equal to a fraction of a period of the reference clock signal, starting from the assertion of the charge signal, and by discharging the capacitance with a discharge current for a time equal to a difference between a duration of a current switching period and a fraction of a period of the reference clock signal.

16. The PWM voltage regulator of claim 15, wherein said correction circuit comprises:
a one-shot circuit having an input configured to receive the charge signal, and being configured to generate an enable flag having a duration equal to a predetermined interval;
a current generator controlled by the enable flag, and configured to generate, at each PWM cycle, one of a positive and negative current pulse based upon a logic state of the enable flag; and
a capacitive element configured to be one of charged and discharged at each PWM cycle with one of the positive and negative current pulses, respectively, and to provide the comparison voltage.

17. The PWM voltage regulator of claim 15, wherein said correction circuit comprises a storage element configured to store a count, and a counting circuit for incrementing or decrementing the count; wherein said counting circuit is configured to increase the counting at each PWM cycle at a first predetermined rate for a time equal to the fraction of the period of the reference clock signal starting from the assertion of the charge signal, and to decrease the count at each PWM cycle at a second predetermined rate for a time equal to the difference between the duration of the current switching period and the fraction of the period of the reference clock signal; and
wherein said counting circuit is configured to generate the comparison voltage with an amplitude corresponding to the count.

18. The PWM voltage regulator of claim 13, wherein said correction circuit further comprises a clamp circuit configured to clamp the comparison voltage with a voltage reference for a regulated output voltage.

19. The PWM voltage regulator of claim 11, wherein said voltage ramp generator is configured to generate the voltage ramp to have a slope proportional to an input voltage.

20. The PWM voltage regulator of claim 11, wherein said correction circuit is configured to generate the comparison voltage by charging and discharging a capacitance at each PWM cycle with currents proportional to a voltage reference for a regulated output voltage.

21. A pulse width modulation (PWM) voltage regulation system comprising:
first and second PWM voltage regulators each comprising
a PWM power stage comprising a plurality of switches and a control circuit configured to control said plurality of switches as a function of a logic command for ending a charge phase and starting a discharge phase to an output capacitance, and to generate a charge signal to be one of enabled and disabled during the charge phase and another of enabled and disabled during the discharge phase,
a circuit configured to determine a duration of the charge phase, to receive the charge signal, to generate the logic command, and to anticipate or delay, at each PWM cycle, the logic command with respect to a previous PWM cycle to synchronize the PWM cycles with a reference clock signal;
said circuit comprising
a voltage ramp generator configured to generate a voltage ramp, said voltage ramp generator being configured to be enabled based upon enabling of the charge signal, and be reset based upon disabling of the charge signal, a comparator configured to compare the voltage ramp with a comparison voltage, and to generate the logic command based upon the comparison, and a correction circuit configured to correct a duration of the charge phase and having an input receiving the charge signal and the reference clock signal, said correction circuit of said first PWM voltage regulator being configured to generate the comparison voltage by one of charging and discharging a capacitance at each PWM cycle with a charge/discharge current for a time based upon the anticipation or delay between the reference clock signal and active edges of the charge signal, said correction circuit of said second PWM voltage regulator being configured to generate the comparison voltage by charging a capacitance at each PWM cycle with a charge current for a time equal to a fraction of a period of the reference clock signal, starting from the assertion of the charge signal, and by discharging the capacitance with a discharge current for a time equal to a difference between a duration of a current switching period and a fraction of a period of the reference clock signal;

said first and second PWM voltage regulators being coupled in parallel to supply a load, said first PWM voltage regulator having an input terminal on which the reference clock signal is received; and a delay element configured to delay half a switching period and coupled to receive active edges of the second charge signal and to provide delayed replicas of the active edges to the input terminal of said first PWM regulator.

22. The PWM voltage regulation system of claim 21, wherein at least one of a phase and a frequency difference between each PWM cycle and a reference clock signal is synchronized.

* * * * *